United States Patent
Xie et al.

(10) Patent No.: US 10,282,004 B2
(45) Date of Patent: May 7, 2019

(54) SUBSTRATE, METHOD FOR MANUFACTURING THE SAME, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Xiaodong Xie, Beijing (CN); Ming Hu, Beijing (CN); Ming Zhang, Beijing (CN); Taofeng Xie, Beijing (CN); Jing Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 17 days.

(21) Appl. No.: 15/122,816

(22) PCT Filed: Dec. 23, 2015

(86) PCT No.: PCT/CN2015/098378
§ 371 (c)(1),
(2) Date: Aug. 31, 2016

(87) PCT Pub. No.: WO2017/020496
PCT Pub. Date: Feb. 9, 2017

(65) Prior Publication Data
US 2017/0185199 A1 Jun. 29, 2017

(30) Foreign Application Priority Data
Aug. 3, 2015 (CN) .......................... 2015 1 0471695

(51) Int. Cl.
*G06F 3/041* (2006.01)
*H01L 27/12* (2006.01)
(Continued)

(52) U.S. Cl.
CPC ............ *G06F 3/0412* (2013.01); *G06F 3/044* (2013.01); *G06F 3/047* (2013.01); *H01L 27/124* (2013.01);
(Continued)

(58) Field of Classification Search
CPC ................... G06F 3/0412; G06F 3/044; G06F 2203/04103; G06F 2203/04107;
(Continued)

(56) References Cited

U.S. PATENT DOCUMENTS

| | | | | |
|---|---|---|---|---|
| 7,499,019 B2* | 3/2009 | Lee | ...................... | G09G 3/3648 345/1.1 |
| 8,780,061 B2* | 7/2014 | Jung | ..................... | G06F 3/0412 178/18.03 |
| 2002/0057403 A1* | 5/2002 | Yasukawa | ......... | G02F 1/136209 349/110 |
| 2006/0027838 A1* | 2/2006 | Koo | .................... | H01L 27/3262 257/257 |

(Continued)

FOREIGN PATENT DOCUMENTS

CN 203930738 U 11/2014
CN 204102102 U 1/2015
(Continued)

OTHER PUBLICATIONS

Written Opinion of the International Searching Authority and International Search Report for International Application No. PCT/CN2015/098378, ISA/CN, dated Apr. 22, 2016. Translation provided by Dragon Intellectual Property Law Firm.
(Continued)

*Primary Examiner* — Stephen G Sherman
(74) *Attorney, Agent, or Firm* — Harness, Dickey & Pierce, P.L.C.

(57) ABSTRACT

The present disclosure relates to the field of display technology, and discloses a substrate and a method for fabricat-
(Continued)

ing the same, and a display device. The substrate includes a plurality of players of conductive lines arranged on a base, and adjacent two layers of conductive lines are arranged with a signal shielding layer there between to eliminate signal crosstalk between the adjacent two layers of conductive lines. And in the direction of arrangement of the same layer of conductive lines, projections of regions of distribution of adjacent two layers of conductive lines on the base are at least partially overlapped with each other.

18 Claims, 4 Drawing Sheets

(51) Int. Cl.
*G06F 3/044* (2006.01)
*G06F 3/047* (2006.01)

(52) U.S. Cl.
CPC .............. *G06F 2203/04103* (2013.01); *G06F 2203/04107* (2013.01)

(58) Field of Classification Search
CPC ................................ G06F 3/041–3/047; G06F 2203/04101–2203/04113; H01L 27/124
USPC ......................................................... 345/174
See application file for complete search history.

(56) References Cited

U.S. PATENT DOCUMENTS

| | | | |
|---|---|---|---|
| 2010/0026661 A1* | 2/2010 | Teramoto ................ | G06F 3/044 345/174 |
| 2013/0307565 A1* | 11/2013 | Ra .......................... | G06F 3/044 324/649 |
| 2014/0054149 A1* | 2/2014 | Tseng ...................... | H01H 1/64 200/5 A |
| 2014/0253826 A1* | 9/2014 | He ......................... | G06F 1/1643 349/12 |
| 2016/0054836 A1 | 2/2016 | Wu et al. | |
| 2016/0291769 A1 | 10/2016 | Wang | |
| 2017/0147124 A1* | 5/2017 | Li .......................... | G06F 3/0416 |
| 2017/0185199 A1 | 6/2017 | Xie et al. | |

FOREIGN PATENT DOCUMENTS

| | | |
|---|---|---|
| CN | 104698711 A | 6/2015 |
| CN | 204406364 U | 6/2015 |
| CN | 104991688 A | 10/2015 |
| CN | 105446514 A | 3/2016 |
| JP | 2013-025447 A | 2/2013 |

OTHER PUBLICATIONS

First Office Action regarding Chinese Application No. 201510471695. 6, dated Aug. 1, 2017. Translation provided by Dragon Intellectual Property Law Firm.

* cited by examiner

SUBSTRATE, METHOD FOR MANUFACTURING THE SAME, AND DISPLAY DEVICE

CROSS-REFERENCE TO RELATED APPLICATION

The present application is the U.S. national phase of PCT Application PCT/CN2015/098378 filed on Dec. 23, 2015, which claims a priority of the Chinese patent application No. 201510471695.6 filed on Aug. 3, 2015, which is incorporated herein by reference in its entirety.

TECHNICAL FIELD

The present disclosure relates to the field of display technology, in particular to a substrate, a method for manufacturing the same, and a display device.

BACKGROUND

Currently, most touch screens used in the market are capacitive touch screens touched by fingers, especially the new generation of touch approaches represented by Apple, so that the capacitive touch screens have been developed greatly, and have been mainly used in mobile phones, tablet computers and so on. With the rapid growth of capacitive touch screens, people have increasingly high requirements for them, such as thickness of touch screen, touch sensitivity, width of bezel and the like. People also have increasingly stringent requirements for product design. Product highlights must be given in the launching of new generations of products. In this case, narrow bezel programs are also admired more and more.

Bezel exists mainly because it is needed to arrange wiring that drives touch electrodes, and in narrow bezel programs, currently there are mainly two ways, one being to reduce line width and line spacing, and the other being to change the wiring. For the former, reducing line width and line spacing will increase line resistance and increase RC Load, and since the current limit for line width and line spacing is 15 um/15 um, reducing further will greatly increase RC Load. For the way of changing the wiring, also because of the need to reduce signal interference, there must be a certain distance between lines, which limits the implementation of narrow bezel.

SUMMARY

The present disclosure provides a substrate and a method for fabricating the same, and a display device, in order to reduce a region covered by a plurality of conductive lines on the substrate.

To solve the above technical problem, the present disclosure provides in embodiments a substrate, the substrate including a wiring region, the substrate including a base and a plurality of players of conductive lines arranged on the base in parallel and located in the wiring region, adjacent two layers of conductive lines being arranged with a signal shielding layer therebetween, the conductive lines and the signal shielding layer being arranged with an insulation layer therebetween, and in the direction of arrangement of the same layer of conductive lines, projections of regions of distribution of adjacent two layers of conductive lines on the base at least partially overlapping.

The present disclosure further provides in the embodiments a method for fabricating the substrate abovementioned, the substrate including a wiring region, the fabrication method including:

providing a base;

correspondingly forming on the base a plurality of players of conductive lines arranged in parallel, the plurality of players of conductive lines being located in the wiring region;

forming a signal shielding layer between adjacent two layers of conductive lines, forming an insulating layer between the conductive lines and the signal shielding layer, and in the direction of arrangement of the same layer of conductive lines, projections of regions of distribution of adjacent two layers of conductive lines on the base at least partially overlapping.

The present disclosure further provides in the embodiments a display device including the substrate as described above.

The beneficial effects of the technical solution of the present disclosure are as follows:

in the technical solution, the conductive lines on the substrate are distributed in a plurality of layers, and adjacent two layers of conductive lines are arranged with a signal shielding layer therebetween to eliminate signal crosstalk between the adjacent two layers of conductive lines. Also, in the direction of arrangement of the same layer of conductive lines, projections of regions of distribution of adjacent two layers of conductive lines on the base at least partially overlap, to reduce the region of distribution of the plurality of players of conductive lines, hence to be able to reduce the width of bezel of the substrate, so that the display device looks more favorable.

BRIEF DESCRIPTION OF THE DRAWINGS

In order to more clearly illustrate the technical solution in the embodiments of the present disclosure or in the prior art, the drawings to be used in the description of the embodiments or the prior art will be introduced simply below. Apparently, the drawings in the following description are merely for some embodiments of the present disclosure. Those of ordinary skill in the art may also obtain other drawings from these drawings, without creative efforts.

DETAILED DESCRIPTION OF THE EMBODIMENTS

The present disclosure will be described hereinafter further in detail in conjunction with the drawings and embodiments. The following embodiments are merely to illustrate the present disclosure, but shall not be used to limit the scope of the present disclosure.

Figure 1:
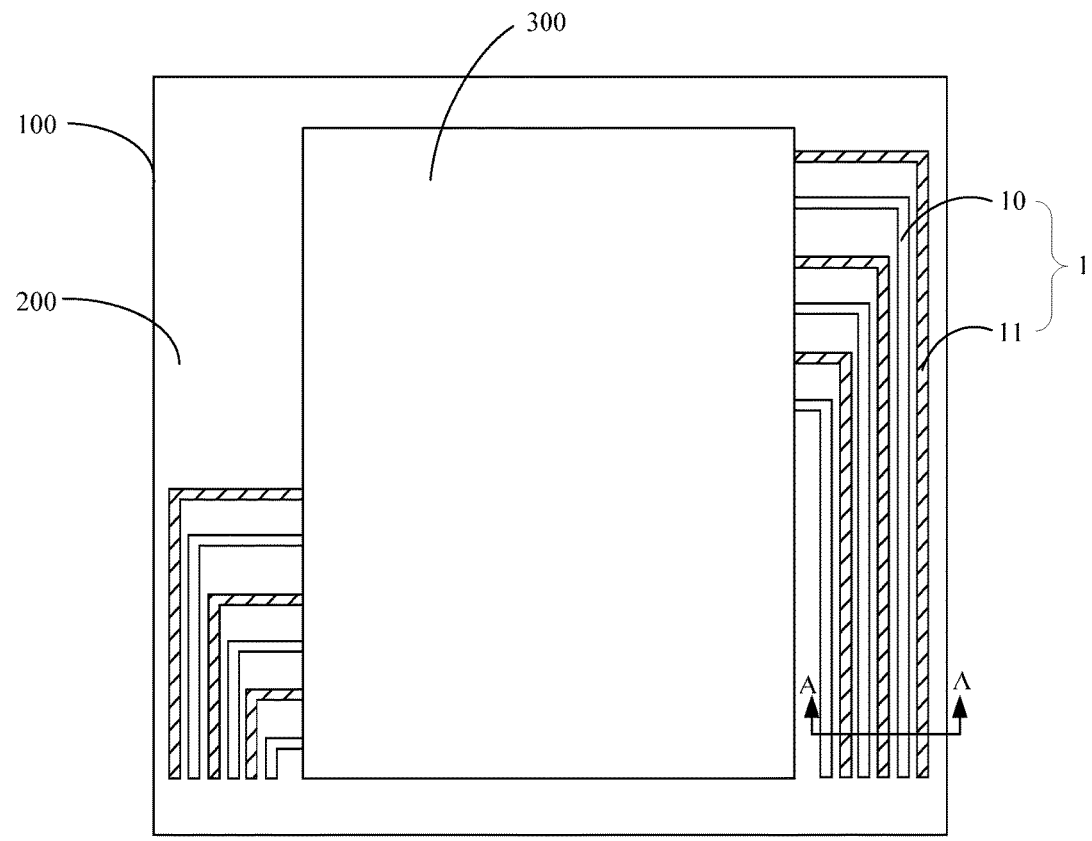
FIG. 1 shows a first way to distribute conductive lines of a wiring region of a substrate in the embodiments of the present disclosure.
Figure 2:
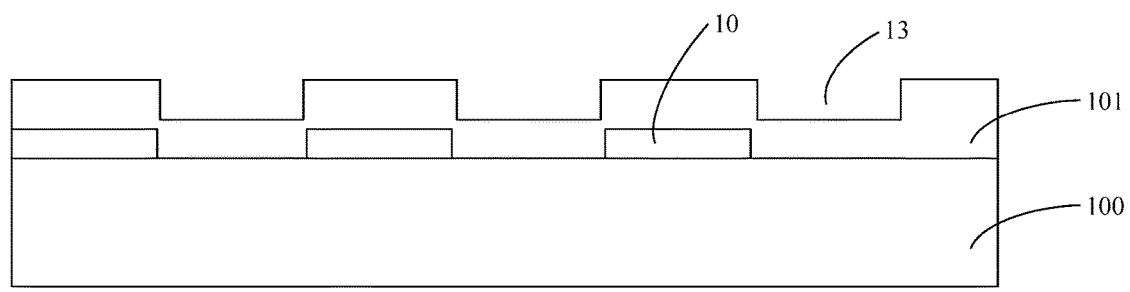
FIGS. 2 and 3 show schematic diagrams of a fabrication process of adjacent two layers of conductive lines in the embodiments of the present disclosure.
Figure 3:
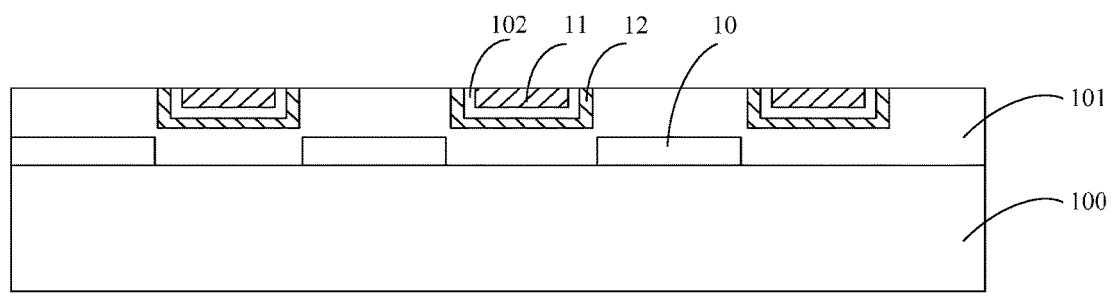

FIG. 1 shows a way to distribute conductive lines of a wiring region of a substrate in the embodiments of the present disclosure. FIG. 2 and FIG. 3 show cross-sectional views along the A-A direction.

In conjunction with FIG. 1 and FIG. 3, the present disclosure provides in embodiments a substrate. The substrate includes a wiring region 200. The substrate includes a base 100 and a plurality of layers of conductive lines 1 arranged on the base 100 in parallel and arranged at the wiring region 200. Adjacent two layers of the conductive lines 1 are arranged with a signal shielding layer 12 therebetween, the conductive lines 1 and the signal shielding layer 12 are arranged with an insulation layer therebetween to eliminate signal crosstalk between the adjacent two conductive lines. Projections of distribution regions of the adjacent two layers of the conductive lines 1 extending along an arrangement direction of the conductive lines 1 onto the base 100 are at least partially overlapped with each other.

Accordingly, the method for manufacturing the substrate includes:

providing a base 100;

forming on the base 100 a plurality of layers of conductive lines 1 arranged in parallel, the plurality of layers of conductive lines 1 being arranged at the wiring region 200;

forming a signal shielding layer 12 between adjacent two layers of conductive lines 1, forming an insulating layer between each of the layers of the conductive lines 1 and the signal shielding layer 12, and projections of distribution regions of the adjacent two layers of the conductive lines 1 extending along an arrangement direction of the conductive lines 1 onto the base 100 are at least partially overlapped with each other.

In the technical solution abovementioned, the adjacent two conductive lines 1 are arranged with a signal shielding layer 12 there between, so as to prevent signal crosstalk between the adjacent two layers of a conductive lines 1 and arrange conductive lines 1 at different layers. And the projections of distribution regions of the adjacent two layers of the conductive lines 1 extending along the arrangement direction of the conductive lines 1 onto the base 100 are at least partially overlapped with each other, thereby reducing the distribution region of the plurality of layers of conductive lines 1 and then narrowing the border of the substrate.

It should be noted that, the plurality of layers of conductive lines 1 arranged in parallel means that conductive lines 1 arranged at the same layer are arranged in parallel and conductive lines 1 arranged at different layers are also arranged in parallel. The arrangement direction of the conductive lines is perpendicular to the extending direction thereof. Moreover, all layers of conductive lines 1 are arranged in the same direction. In the direction of arrangement of conductive lines 1 in the same layer, the distribution region of each layer of conductive lines 1 refers to the region extending along the arrangement direction of the layer of the conductive lines 1 and defined by the first conductive line 1 at one side and the last conductive line 1 at the other side. Unless otherwise specified, the reduction of the distribution region of the plurality of conductive lines 1 is the reduction of extending distance of region of distribution of the plurality of conductive lines 1 in the direction of arrangement of the conductive lines 1.

Optionally, the conductive lines 1 are parallel to the sides of the substrate, and the reduction of region of distribution of the conductive lines 1 can be directly equivalent to the reduction of border width of the substrate. Of course, those skilled in the art can appreciate that, the conductive lines 1 also may have a certain angle with the sides of the substrate, and the technical solution of the present disclosure when used can reduce the bezel width of the substrate. Specifically it can be set that the conductive lines 1 have a certain angle α (0°≤α<90°) with the sides of the substrate.

Wherein the conductive lines 1 include first conductive lines 10 and second conductive lines 11 located in adjacent two layers, the first conductive lines 10 are covered by a first insulating layer 101, the signal shielding layer 12 is arranged on the first insulating layer 101, the signal shielding layer 12 is covered by a second insulating layer 102, and the second conductive lines 11 are arranged on the second insulating layer 102. The method for manufacturing the substrate includes:

forming the first conductive lines 10 on the base 100;

forming the first insulating layer 101 covering the first conductive lines 10;

forming the signal shielding layer 12 on the first insulating layer 101;

forming the second insulating layer 102 covering the signal shielding layer 12;

forming the second conductive lines 11 on the second insulating layer 102.

Optionally, a plurality of grooves 13 is arranged at the surface of the first insulating layer 101, the second conductive lines 11 are arranged on the second insulating layer 102 in the groove 13 to thin the plurality of layers of conductive lines 1, and then reduce the adverse influence on the thickness of the substrate from the distribution of the plurality of conductive lines 1, in combination shown in FIGS. 2 and 3.

Further, optionally, the signal shielding layer 12 is arranged to cover the inner walls of the groove 13 merely. Specifically, the signal shielding layer 12 covers the bottom and side walls of the groove 13, with a better signal shielding effect. At the same time, since the signal shielding layer 12 is arranged within the groove 13, the thickness of the substrate may not be increased due to the signal shielding layer 12.

For the same reason, the second insulating layer 102 can also be arranged merely in the groove 13, so that all of the signal shielding layer 12, the second insulating layer 102 and the second conductive lines 11 are arranged in the groove 13, the surface of the second conductive lines 11 are substantially aligned with the surface of the second insulating layer 102, and the thickness of the substrate may not be increased due to the distribution of the plurality of conductive lines 1.

The method for manufacturing the substrate specifically includes:

forming the first conductive lines 10 on the base 100;

forming the first insulating layer 101 covering the first conductive lines 10;

forming the plurality of grooves 13 at the surface of the first insulating layer 101;

forming the signal shielding layer 12 on the first insulating layer 101 within the groove 13, where the signal shielding layer 12 covers the inner walls of the groove 13;

forming the second insulating layer 102 covering the signal shielding layer 12, where the second insulating layer 102 is merely arranged within the groove 13;

forming the second conductive lines 11 on the second insulating layer 102.

In the embodiments of the present disclosure, as for the first conductive lines 10 and the second conductive lines 11 at adjacent two layers, in the direction of distribution of the first conductive lines 10 and the second conductive lines 11, the projections of distribution regions of the first conductive lines 10 and the second conductive lines 11 onto the base 100 are at least partially overlapped with each other, and in the overlapping region, the second conductive lines 11 are arranged to correspond to the region between the first conductive lines 10, that is, the second conductive lines 11 are arranged to correspond to the region of line spacing between the first conductive lines 10, and the first conductive lines 10 and the second conductive lines 11 are alternately arranged as shown in FIG. 3, which can effectively utilize the space of the line spacing in order for no line spacing or very small line spacing between conductive lines, so as to reduce the distribution region of the plurality of layers of conductive lines 1 and reduce the border width of the substrate.

Further, it may also be set that the projection of the distribution region of the second conductive lines 11 onto the base 100 completely falls within the projection of the distribution region of the first conductive lines 10 onto the base 100, the second conductive lines 11 are arranged to correspond to the regions between the first conductive lines 10, so that the width of the distribution region of the first conductive lines 10 and the second conductive lines 11 is merely about the width of the distribution region of the first conductive lines 10, thereby further narrowing the border of the substrate. At this time, it is merely required to appropriately design the number of conductive lines at each layer.

Of course, in the overlapping region, it may also be set that the positions of the first conductive lines 10 are in one-to-one correspondence to the second conductive lines. To be specific, the projection of the distribution region of the second conductive lines 11 onto the base 100 completely falls within the projection of the distribution region of the first conductive lines 10 onto the base 100, or the projection of the distribution region of the second conductive lines 11 onto the base 100 is partially overlapped with the projection of the distribution region of the first conductive lines 10 onto the base 100.

In some embodiments, the conductive lines 1 merely include the first conductive lines 10 and the second conductive lines 11 arranged at adjacent two layers, the first conductive lines 10 are covered by the first insulating layer 101, a plurality of grooves 13 is arranged at the surface of the first insulating layer 101 and the grooves 13 are arranged to correspond to the regions between the first conductive line 10, that is, the grooves 13 are arranged to correspond to the region of the line spacing between the first conductive lines 10, as shown in FIG. 2. The first signal shielding layer 12 is arranged on the first insulating layer 101 and the signal shielding layer 12 covers merely the inner walls of the grooves 13, specifically, the signal shielding layer 12 is arranged on the second insulating layer 102 within the grooves 13, so as to cover the bottom and side walls of the grooves 13, with a better signal shielding effect. At the same time, the provision of the signal shielding layer 12 will not increase the thickness of the substrate. The second insulating layer 102 is arranged on the signal shielding layer 12 and the second insulating layer 102 is arranged merely within the grooves 13. The second conductive lines 11 are arranged on the second insulating layer 102 within the grooves 13. Since all of the signal shielding layer 12, the second insulating layer 102 and the second conductive lines 11 are located within the grooves 13, the surface of the second conductive lines 11 is substantially aligned with the surface of the second insulating layer 102 so that the distribution of the plurality of conductive lines will not increase the thickness of the substrate.

When it is required to form the grooves 13 on the first insulating layer 101 covering the first conductive lines 10, specifically the grooves 13 may be formed by stamping.

Wherein, the material of the first conductive lines 10 may be a metal, such as Cu, Al, Ag, Mo, Cr, Nd, Ni, Mn, Ti, Ta, W, etc. and alloys of these metals, or transparent conductive materials like indium tin oxide, or indium zinc oxide. The material of the second conductive lines 11 includes nano-silver.

Specifically, the material of the second conductive lines 11 may be nano-silver conductive paste (referred to as nano-silver paste), and the nano-silver paste is a stable even dispersed system by dispersing nano-silver particles of high concentration (up to 80%) in a solvent and resin binder. Through printing or other processes, it is transferred to a flexible printing stock to form highly transparent conductive lines. Compared with ordinary micron silver conductive paste, the nano-silver conductive paste can exhibit on applications of transparent flexible touch screen in the following aspects: the nano-silver particles are smaller and can meet the requirements for low-temperature sintering to obtain high conductivity and expand the range of flexible substrates, while at the same time being able to fabricate more subtle conductive lines; adopting tough resin as binder, lines fabricated of the nano-silver conductive paste has higher flexibility. The three obvious advantages make the nano-silver paste become a new material of flexible touch screen.

The substrate in the embodiments of the present disclosure may be a touch substrate, and may also be a display substrate.

When the substrate is a touch substrate, the substrate includes a touch region 300, a wiring region 200 arranged at the peripheral of the touch region 300. The touch substrate includes a plurality of touch electrodes (not shown) arranged in the touch region 300 and arranged in parallel, and the conductive lines 1 of the wiring region 200 are connected to the touch electrodes correspondingly to provide the touch electrodes with touch signal.

In a specific application process, it may be set that the conductive lines 1 merely include the first conductive lines 10 and the second conductive lines 11 located in adjacent two layers, to reduce impacts on the thickness of the touch substrate while meeting that the multi-layer wiring reduces the bezel of the touch substrate. Wherein, the first conductive lines 10 may be arranged in the same layer and with the same material as the touch electrodes. The second conductive lines 11 may be made of materials including nano-silver.

Preferably, a plurality of grooves 13 are arranged on the first insulating layer 101 of the first conductive lines 10, and the second conductive lines 11, the signal shielding layer 12 as well as the second insulating layer 102 located between the second conductive lines 11 and the signal shielding layer 12 are arranged merely in the grooves 13, which does not increase the thickness of the touch substrate since it is merely required to add the process of fabricating the second conductor lines 11, the signal shielding layer 12 and the second insulating layer 102.

Wherein, the grooves 13 can be fabricated in a fabricating way with low costs. The first conductive lines 10 and the touch electrodes are formed by a patterning process for the same film layer and are arranged in the same layer and with the same material. The second conductive lines 11 are made of nano-silver conductive paste.

It is defined in embodiments of the present disclosure that the touch electrodes of the touch substrate extend from a first side of the substrate to an opposite second side.

Figure 4:
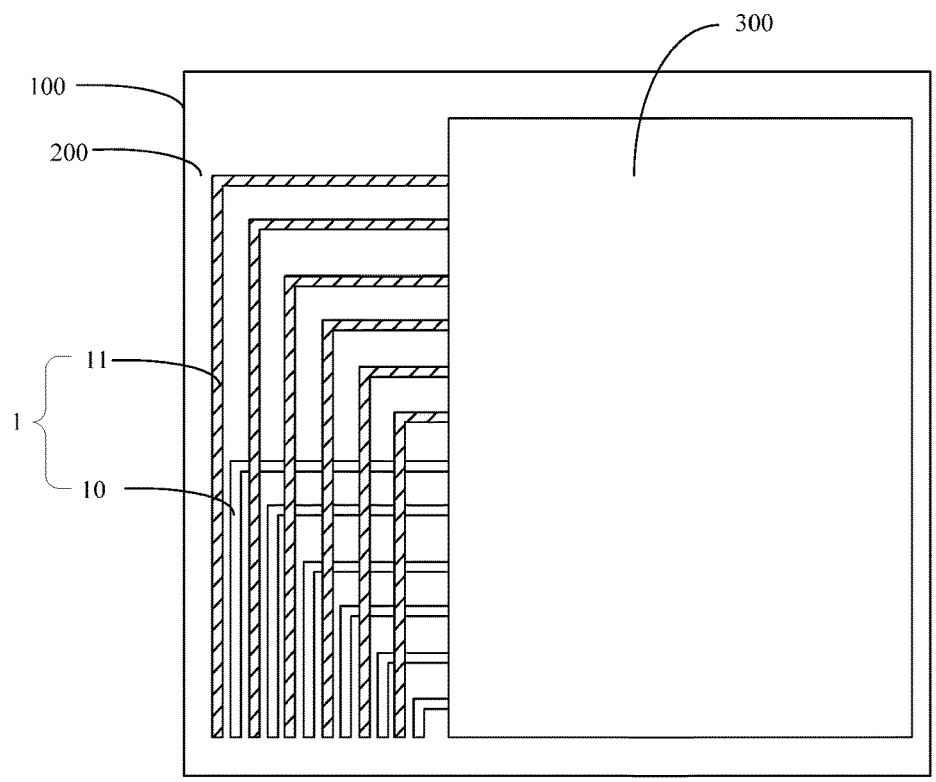
FIG. 4 shows a second way to distribute conductive lines of a wiring region of a substrate in the embodiments of the present disclosure.

In some embodiments, as shown in FIG. 4, the first conductive lines 10 and the second conductive lines 11 are merely located on the first side or the second side of the touch substrate, a part of the touch electrodes are electrically connected to the corresponding first conductive lines 10, and the other part of the touch electrodes are electrically connected to the corresponding second conductive lines 11.

Specifically, the first conductive lines 10 and the second conductive lines 11 are located merely on the first side of the touch substrate, or the first conductive lines 10 and the second conductive lines 11 are located merely on the second side of the touch substrate, and the first conductive lines 10 and the second conductive lines 11 are located on the same side of the touch substrate. The driving way of the touch electrodes of the touch substrate is single-drive, that is, merely one end of the touch electrodes is electrically connected to the first conductive lines 10 or the second conductive lines 11.

Taking a touch substrate including twelve touch electrodes as an example, in the embodiment, six first conductive lines 10 and six second conductive lines 11 may be arranged, wherein, five second conductive lines 11 are arranged to correspond to the region between the first conductive lines 10. The six first conductive lines 10 are electrically connected one-to-one to the corresponding touch electrodes in the lower half of the touch substrate, and the six second conductive lines 11 are electrically connected one-to-one to the corresponding touch electrodes in the upper half of the touch substrate, as shown in FIG. 4.

Figure 6:
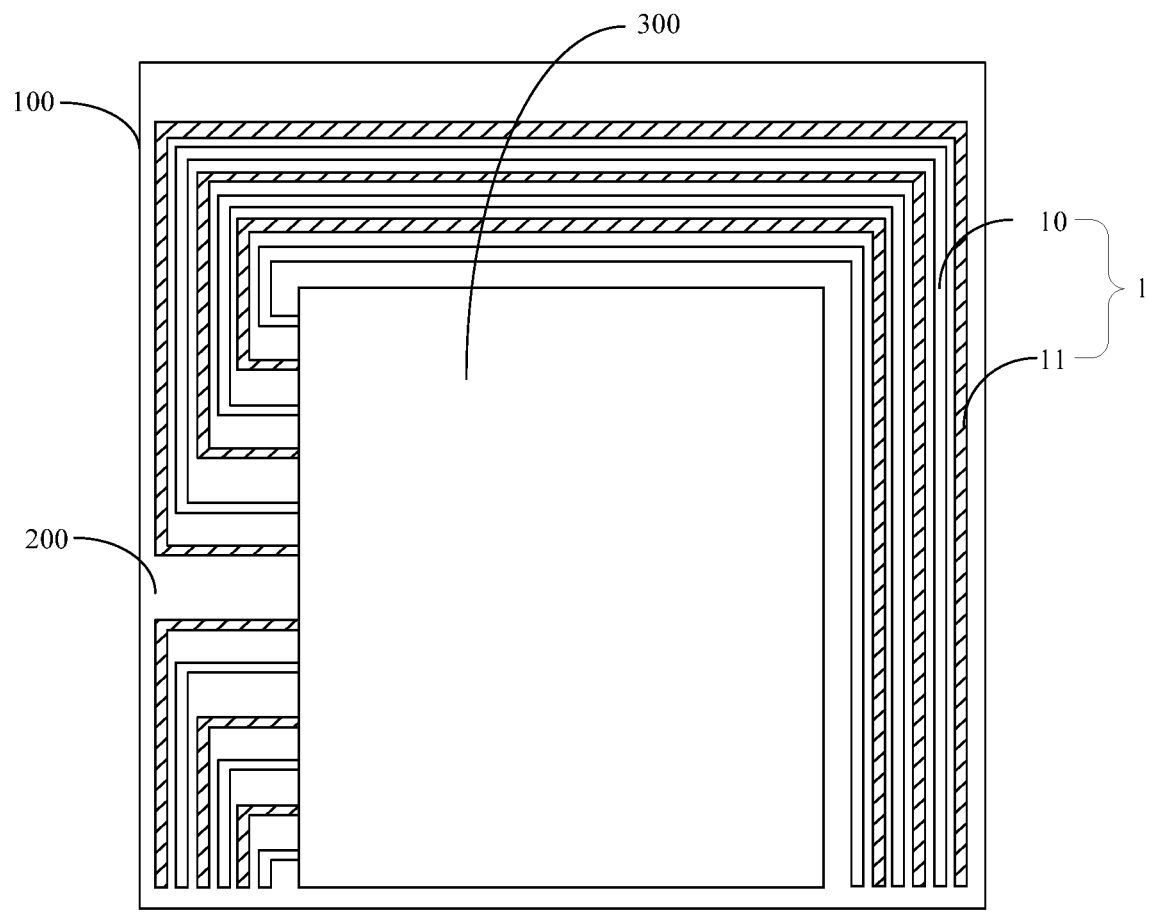
FIG. 6 shows a fourth way to distribute conductive lines of a wiring region of a substrate in the embodiments of the present disclosure.

In some embodiments, in combination with FIGS. 1 and 6, a part of the first conductive lines 10 and a part of the second conductive lines 11 are located on the first side of the touch substrate, the other part of the first conductive lines 10 and the other part of the second conductive lines 11 are located on the second side of the substrate. A part of the touch electrodes is electrically connected to the corresponding conductive lines 10, and the other part of the touch electrodes is electrically connected to the corresponding second conductive lines 11.

Specifically, a part of the first conductive lines 10 and a part of the second conductive lines 11 are located merely on the first side of the touch substrate, the other part of the first conductive lines 10 and the other part of the second conductive lines 11 are located merely on the second side of the touch substrate, the first and second sides of the touch substrate are arranged with the first conductive lines 10 and the second conductive lines 11. The driving way of the touch electrodes of the touch substrate is single-drive, that is, merely one end of the touch electrodes is electrically connected to the corresponding first conductive lines 10 or the second conductive lines 11.

Preferably, the numbers of the conductive lines on the first side and the second side of the touch substrate are the same.

Taking a touch substrate including twelve touch electrodes as an example, in the embodiment, three first conductive lines 10 and three second conductive lines 11 may be arranged on the first side of the touch substrate, and the other three first conductive lines 10 and the other three second conductive lines 11 are arranged on the second side of the touch substrate. For the first conductive lines 10 and the second conductive lines 11 located on the same side, the two second conductive lines 11 are arranged to correspond to the region between the first conductive lines 10. For the touch electrodes in the lower half of the touch substrate, a part thereof is electrically connected to and corresponds one-to-one to the first conductive lines 10 on the first side, and the other part thereof is electrically connected to and corresponds one-to-one to the second conductive lines 11 on the first side. For the touch electrodes in the upper half of the touch substrate, a part thereof is electrically connected to and corresponds one-to-one to the first conductive lines 10 on the second side, and the other part is electrically connected to and corresponds one-to-one to the second conductive lines 11 on the second side, as shown in FIGS. 1 and 6.

Figure 5:
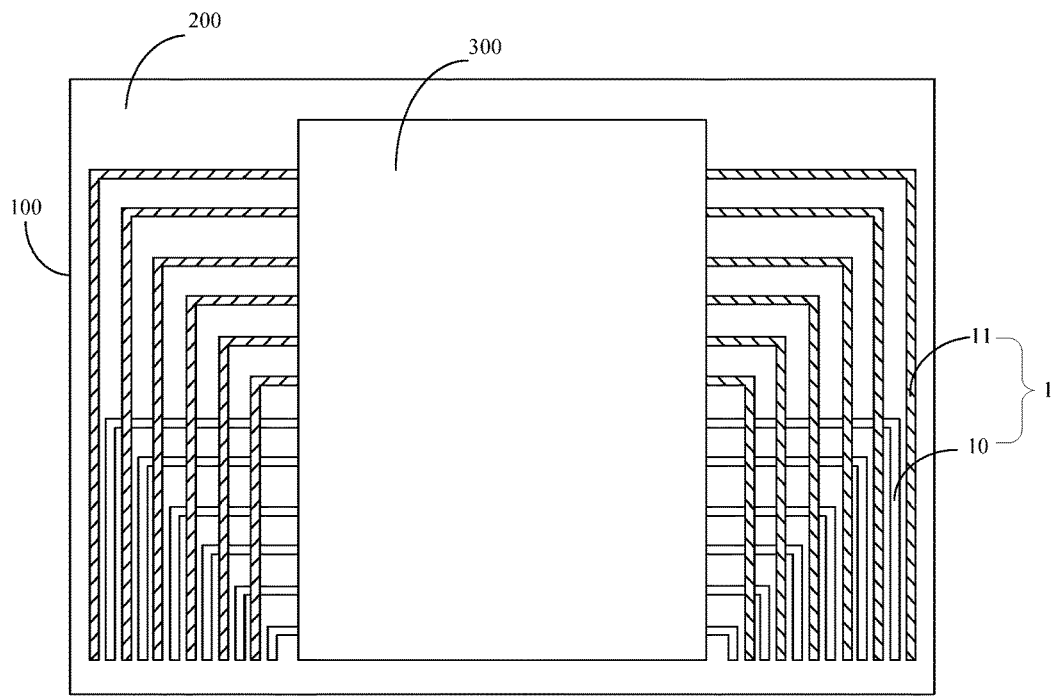
FIG. 5 shows a third way to distribute conductive lines of a wiring region of a substrate in the embodiments of the present disclosure.

In some embodiments, as shown in FIG. 5, a part of the first conductive lines 10 and a part of the second conductive lines 11 are located on the first side of the touch substrate, and the other part of the first conductive lines 10 and the other part of the second conductive lines 11 are located on the second side of the touch substrate. The first end of a part of the touch electrodes is electrically connected to the corresponding first conductive lines 10, the first end of the other part of the touch electrodes is electrically connected to the corresponding second conductive lines 11, and the second end of the part of the touch electrodes is electrically connected to the corresponding first conductive lines 10, the second end of the other part of the touch electrodes is electrically connected to the corresponding second conductive lines 11.

Specifically, a part of the first conductive lines 10 and a part of the second conductive lines 11 are located merely on the first side of the touch substrate, the other part of the first conductive lines 10 and the other part of the second conductive lines 11 are merely located on the second side of the touch substrate, and the first and second sides of the touch substrate are arranged with the first conductive lines 10 and the second conductive lines 11. The driving way of the touch electrodes of the touch substrate is dual-drive, that is, both ends of a certain touch electrode are electrically connected to the corresponding first conductive lines 10 or the second conductive lines 11.

Taking a touch substrate including twelve touch electrodes as an example, in the embodiment, six first conductive lines 10 and six second conductive lines 11 may be arranged on the first side of the touch substrate, while the other six first conductive lines 10 and the other six second conductive lines 11 are located on the second side of the touch substrate. For the first conductive lines 10 and the second conductive lines 11 located on the same side, five second conductive lines 11 correspond to the region between the first conductive lines 10. A part of the touch electrodes is near to the first end of the first side and is electrically connected to and corresponds one-to-one to the first conductive lines 10 on the first side, the other part of the touch electrodes is near to the first end of the first side and is electrically connected to and corresponds one-to-one to the second conductive lines 11 on the first side. The part of the touch electrodes is near to the second end of the second side and is electrically connected to and corresponds one-to-one to the second conductive lines 10, and the other part of the touch electrodes is near to the second end of the second side and is electrically connected to and corresponds one-to-one to the second conductive lines 11, as shown in FIG. 5.

When the substrate is a display substrate and particularly is a thin film transistor array substrate, the substrate includes a display region, and the wiring region is located on the peripheral of the display region. The array substrate includes a plurality of gate lines located in the display region and arranged in parallel, and the conductive lines of the wiring region are connected to the corresponding gate lines, for supplying a scanning signal to the gate lines.

Specifically it may be set that the conductive lines include merely the first conductive lines and the second conductive lines located in adjacent two layers.

Wherein the first conductive lines may be arranged in the same layer as the gate lines with the same material, and are specifically fabricated by a gate metal, such as Cu, Al, Ag, Mo, Cr, Nd, Ni, Mn, Ti, Ta, W and the like as well as alloys of these metals. The second conductive lines can be fabricated by materials including nano-silver, and are specifically fabricated by nano conductive silver paste.

The present disclosure further provides in the embodiments a display device including the above-described substrate, which can reduce the region covered by the conductive lines in the wiring region, thereby reducing the bezel of the substrate, so that the display device looks more favorable.

The display device may be: mobile phone, tablet computer, television, display, notebook computer, digital picture frame, navigator and any product or component having a display function.

The above are merely the preferred embodiments of the present disclosure, and it should be noted that, those of ordinary skill in the art may make further several modifications and alternations without departing from the technical principle of the present disclosure, and these modifications and alternations shall also be construed to fall within the scope of the present disclosure.

What is claimed is:

1. A substrate, comprising a wiring region, a base and a plurality of layers of conductive lines which are arranged on the base and parallel to each other at the wiring region, wherein a signal shielding layer is arranged between two adjacent layers of the conductive lines, an insulation layer is arranged between each of the layers of the conductive lines and the signal shielding layer, and projections of distribution regions of the two adjacent layers of the conductive lines extending along an arrangement direction of the conductive lines onto the base are at least partially overlapped with each other;
    wherein the conductive lines comprise first conductive lines and second conductive lines which are arranged at the two adjacent layers respectively;
    a first insulating layer is arranged on the first conductive lines, a plurality of grooves is arranged at a surface of the first insulating layer, and the second conductive lines are arranged in the grooves; and
    the signal shielding layer covers a side wall and a bottom surface of each of the grooves;
    wherein an upper surface of the signal shielding layer located distal from the base is co-planar with an upper surface of the second conductive line located distal from the base; and
    the signal shielding layer within each groove includes a pair of vertical portions that are arranged perpendicular to the base and are separated from each other, and a second insulating layer and the second conductive line are arranged between the pair of vertical portions of the signal shielding layer.

2. The substrate according to claim 1, wherein the second conductive lines are arranged at positions corresponding to regions between the first conductive lines at a region where the projections of the distribution regions of the two adjacent layers of the conductive lines extending along the arrangement direction of the conductive lines onto the base are overlapped.

3. The substrate according to claim 1, wherein the second insulating layer is arranged on the signal shielding layer within each of the grooves; and
    each of the second conductive lines is arranged on the second insulating layer.

4. The substrate according to claim 1, wherein the conductive lines are parallel to corresponding edges of the substrate.

5. The substrate according to claim 1, wherein the substrate is a touch substrate comprising a touch region, the wiring region is arranged at a periphery of the touch region;
    the touch substrate comprises a plurality of touch electrodes arranged at the touch region and parallel to each other, and each of the conductive lines is connected to a corresponding touch electrode, so as to provide a touch signal to the corresponding touch electrode.

6. The substrate according to claim 5, wherein
    the touch electrodes extend from a first side of the substrate to an opposite second side, the first conductive lines and the second conductive lines are arranged at the first side or the second side of the touch substrate, a part of the touch electrodes is electrically connected to the corresponding first conductive lines, and the other part of the touch electrodes is electrically connected to the corresponding second conductive lines.

7. The substrate according to claim 6, wherein the first conductive lines are made of a material and arranged at a layer identical to the touch electrodes.

8. The substrate according to claim 5, wherein
    the touch electrodes extend from a first side of the substrate to an opposite second side, a part of the first conductive lines and a part of the second conductive lines are arranged at the first side of the touch substrate, the other part of the first conductive lines and the other part of the second conductive lines are arranged at the second side of the touch substrate;
    a part of the touch electrodes is electrically connected to the corresponding first conductive lines, and the other part of the touch electrodes is electrically connected to the corresponding second conductive lines;
    wherein merely one end of each of the touch electrodes is electrically connected to the corresponding first conductive line or the corresponding second conductive line.

9. The substrate according to claim 8, wherein the number of the conductive lines at the first side of the touch substrate is identical to the number of the conductive lines at the second side of the touch substrate.

10. The substrate according to claim 5, wherein
    the touch electrodes extend from a first side of the substrate to an opposite second side, a part of the first conductive lines and a part of the second conductive lines are arranged at the first side of the touch substrate, the other part of the first conductive lines are arranged at the first side and the second side of the touch substrate, and the other part of the second conductive lines are arranged at the first side and the second side of the touch substrate;
    a part of the touch electrode is electrically connected to the corresponding first conductive lines, the other part of the touch electrodes is electrically connected the corresponding second conductive lines;
    wherein the touch electrodes are electrically connected to the first conductive lines or the second conductive lines at one side of the substrate.

11. The substrate according to claim 5, wherein
the touch electrodes extend from a first side of the substrate to an opposite second side, each of the touch electrodes comprises a first end at the first side of the substrate and a second end at a second side of the substrate;
the touch electrodes comprise a first part of the touch electrodes and a second part of the touch electrodes;
a part of the first conductive lines and a part of the second conductive lines are arranged at the first side of the touch substrate, the other part of the first conductive lines and the other part of the second conductive lines are arranged at the second side of the touch substrate;
first ends of the first part of the touch electrodes are electrically connected to the corresponding first conductive lines, first ends of the second part of the touch electrodes are electrically connected to the corresponding second conductive lines, and second ends of the first part of the touch electrodes are electrically connected to the other part of the first touch conductive lines, and second ends of the second part of the touch electrodes are electrically connected to the other part of the second conductive lines.

12. The substrate according to claim 1, wherein the substrate is a thin film transistor array substrate comprising a display region, the wiring region is arranged at the periphery of the display region;
the array substrate comprises a plurality of gate lines arranged at the display region and parallel to each other, and the conductive lines are connected to the corresponding gate lines, so as to apply scanning signals to the gate lines.

13. The substrate according to claim 12, wherein the first conductive lines are made of a material and arranged at a layer identical to the gate lines, and the second conductive lines are made of a material comprising nano-silver.

14. The substrate according to claim 1, wherein the distribution region of each layer of the conductive lines is a region extending along the arrangement direction of the layer of the conductive lines and defined by a first conductive line at one side and a last conductive line at the other side.

15. A method for manufacturing the substrate according to claim 1, comprising:
providing the base;
forming, on the base, the plurality of layers of conductive lines arranged parallel to each other and arranged at the wiring region;
forming the signal shielding layer between two adjacent layers of conductive lines; and
forming the insulating layer between each of the layers of the conductive lines and the signal shielding layer;
wherein the forming of the plurality of layers of conductive lines includes forming the first conductive lines on the base,
the forming of the insulating layer includes forming the first insulating layer covering the first conductive lines, and forming the plurality of grooves at the surface of the first insulating layer, and
the forming the signal shielding layer includes forming the signal shielding layer within the grooves.

16. The method according to claim 15, wherein the second conductive lines are arranged at positions corresponding to regions between the first conductive lines at a region where the projections of the distribution regions of the adjacent two layers of the conductive lines extending along the arrangement direction of the conductive lines onto the base are overlapped and the method comprises:
forming the second insulating layer on the signal shielding layer; and
forming the second conductive lines on the second insulating layer within the grooves.

17. The method according to claim 15, wherein the plurality of grooves are formed at the surface of the first insulating layer by stamping.

18. A display device, comprising the substrate according to claim 1.

* * * * *